(12) United States Patent
James et al.

(10) Patent No.: US 9,351,430 B2
(45) Date of Patent: May 24, 2016

(54) RENEWABLE ENERGY BASED DATACENTER COOLING

(71) Applicant: Microsoft Corporation, Redmond, WA (US)

(72) Inventors: Sean M James, Olympia, WA (US); Brandon Aaron Rubenstein, Lynnwood, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 219 days.

(21) Appl. No.: 13/917,636

(22) Filed: Jun. 13, 2013

(65) Prior Publication Data

US 2014/0368991 A1 Dec. 18, 2014

(51) Int. Cl.
  *G06F 1/20* (2006.01)
  *H05K 5/00* (2006.01)
  *H05K 7/20* (2006.01)

(52) U.S. Cl.
  CPC ........ *H05K 7/20781* (2013.01); *H05K 7/20827* (2013.01)

(58) Field of Classification Search
  CPC ................. H05K 7/20781; H05K 7/20827
  USPC .......... 361/679.46–679.54, 688–723; 165/45, 165/53
  See application file for complete search history.

(56) References Cited

U.S. PATENT DOCUMENTS

| 6,076,595 | A | 6/2000 | Austin et al. |
| 2009/0073652 | A1 | 3/2009 | Matser et al. |
| 2009/0168345 | A1 | 7/2009 | Martini |
| 2009/0254763 | A1 | 10/2009 | Belady et al. |
| 2009/0283386 | A1 | 11/2009 | Diluoffo et al. |
| 2010/0136895 | A1 | 6/2010 | Sgro |
| 2010/0139736 | A1* | 6/2010 | Teichmann et al. ........... 136/246 |

(Continued)

FOREIGN PATENT DOCUMENTS

WO  0062590 A1  10/2000

OTHER PUBLICATIONS

Miller, Rich, "Hot Water Cooling? Three Projects Making it Work", Retrieved at <<http://www.datacenterknowledge.com/archives/2012/06/25/hot-water-cooling/>>, Jun. 25, 2012, pp. 4.

(Continued)

*Primary Examiner* — Anthony Haughton
*Assistant Examiner* — Yahya Ahmad
(74) *Attorney, Agent, or Firm* — Henry Gabryjelski; Kate Drakos; Micky Minhas (57) ABSTRACT

A data center is cooled through hydronic convection mechanisms, geothermal mechanisms or combinations thereof. The individual computing devices of such a data center are cooled through a thermally conductive interface with a liquid. The liquid's container can extend to a cooling apparatus located physically above such computing devices to provide hydronic convection cooling, or it can extend into the earth, either in the form of a heat pipe, or in the form of conduits through which the liquid is actively pumped. The hydronic convection cooling and geothermal heat pipe cooling operate via temperature differentials and consume no external electrical power. Geothermal cooling avoids heat soak by utilizing multiple different sets of conduits extending into the earth, where at least some of those sets of conduits are not utilized for a period of time. Combinations of hydronic convection mechanisms and geothermal cooling can also be utilized.

20 Claims, 6 Drawing Sheets

(56) References Cited

U.S. PATENT DOCUMENTS

| | | |
|---|---|---|
| 2011/0127027 A1 | 6/2011 | Kashirajima et al. |
| 2011/0247348 A1 | 10/2011 | Mashiko et al. |
| 2011/0303394 A1* | 12/2011 | Branton .................... 165/104.33 |
| 2012/0048514 A1* | 3/2012 | Osbaugh .................. 165/104.21 |
| 2012/0090808 A1 | 4/2012 | Scofield |
| 2012/0106073 A1 | 5/2012 | Wu et al. |
| 2012/0138285 A1* | 6/2012 | Tsubaki et al. ................ 165/293 |
| 2012/0140415 A1 | 6/2012 | Driggers |
| 2013/0047653 A1 | 2/2013 | Keisling et al. |
| 2013/0077232 A1* | 3/2013 | Nordin et al. ............ 361/679.47 |
| 2013/0081781 A1 | 4/2013 | Chainer et al. |
| 2013/0091881 A1 | 4/2013 | Ito et al. |
| 2013/0138252 A1 | 5/2013 | Chainer et al. |
| 2014/0124164 A1* | 5/2014 | Campbell et al. ................ 165/45 |

OTHER PUBLICATIONS

Iyengar, et al., "Server Liquid Cooling with Chiller-less Data Center Design to Enable Significant Energy Savings", Retrieved at <<http://ieeexplore.ieee.org/stamp/stamp.jsp?tp=&arnumber=6188851>>, In 28th Annual IEEE Semiconductor Thermal Measurement and Management Symposium, Mar. 18, 2012, pp. 12.

International Search Report and Written Opinion Issued in PCT Patent Application No. PCT/US2014/040433, Mailed Date: Jan. 27, 2015, 26 Pages.

* cited by examiner

RENEWABLE ENERGY BASED DATACENTER COOLING

BACKGROUND

The throughput of communications, between multiple computing devices that are transmitted via network connections, continues to increase. Modern networking hardware enables physically separate computing devices to communicate with one another orders of magnitude faster than was possible with prior generations of networking hardware. Furthermore, high-speed network communication capabilities are being made available to a greater number of people, both in the locations where people work, and in their homes. As a result, an increasing amount of data and services can be meaningfully provided via such network communications. Additionally, it has become more practical to perform digital data processing at a location remote from the user requesting such processing, or on whose behalf such processing is being performed. Consequently, large quantities of data processing capability can be aggregated into centralized locations, comprising dedicated hardware and support systems, and can then be shared across networks.

To provide such data and processing capabilities, via network communications, from a centralized location, the centralized location typically comprises hundreds or thousands of computing devices, typically mounted in vertically oriented racks. Such a collection of computing devices, as well as the associated hardware necessary to support such computing devices, and the physical structure that houses the computing devices and associated hardware, is traditionally referred to as a "data center". With the increasing availability of high-speed network communication capabilities, and thus the increasing provision of data and services from centralized locations, as well as the traditional utilization of data centers, such as the provision of advanced computing services and massive amounts of computing processing capability, the size and quantity of data centers continues to increase.

However, computing devices can generate heat when performing processing. The aggregation of large quantities of computing devices in a single data center results in large quantities of heat being generated that must be removed in order to enable the computing devices to continue to operate optimally and avoid overheating. Traditionally, data center cooling is provided by forced-air mechanisms that deliver cool air into a data center and remove hot air therefrom. The cool air is typically provided by cooling outside, ambient air through the use of power consuming cooling methodologies, such as air-conditioning. Such mechanisms can introduce substantial cost into the operation of a data center. For example, large air conditioning units, such as are typically required by a data center, can consume large quantities of electrical power, often during the most expensive times of the day, resulting in high energy costs. Additionally, by utilizing ambient air, airborne particulates and impurities are introduced into the data center, where they can cause damage to the sensitive computing hardware contained therein.

SUMMARY

In one embodiment, a data center can be cooled through hydronic convection mechanisms, where the individual computing devices of such a data center are cooled through a thermally conductive interface with a liquid whose container also extends to a cooling apparatus located physically above such computing devices. By virtue of a temperature differential between the heat-generating computing devices and the cooling apparatus, the liquid can continuously circulate, removing heat from the computing devices and delivering it to the cooling apparatus, without the consumption of electrical power. The cooling apparatus can be external to the data center, and can be cooled through heat radiation into the ambient air, thereby enabling the entire cooling apparatus to operate without the consumption of electrical power.

In another embodiment, the data center can be cooled through geothermal cooling mechanisms, where the individual computing devices of such a data center are cooled through a thermally conductive interface with one or more heat pipes that can extend into the earth. Such heat pipes can transfer the heat from the computing devices of the data center to the earth without the consumption of electrical power.

In yet another embodiment, the data center can be cooled through geothermal cooling mechanisms, where the individual computing devices of such a data center are cooled through a thermally conductive interface with a liquid that can be actively pumped through conduits extending into the earth, thereby transferring heat from the computing devices of the data center to the earth. To avoid heat soak, such an embodiment can comprise multiple different sets of conduits extending into the earth, where at least some of those sets of conduits are not utilized for a period of time.

In a further embodiment, a data center can be cooled through combinations of hydronic convection mechanisms and geothermal cooling. The cooling apparatus of the hydronic convection mechanisms can comprise geothermal heat pipes or multiple conduits comprising actively pumped liquid.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

DESCRIPTION OF THE DRAWINGS

The following detailed description may be best understood when taken in conjunction with the accompanying drawings, of which.

DETAILED DESCRIPTION

The following descriptions relate to the removal of the heat generated by the computing devices in a data center. A data center can be cooled through hydronic convection mechanisms, where the individual computing devices of such a data center are cooled through a thermally conductive interface with a liquid whose container also extends to a cooling apparatus located physically above such computing devices. By virtue of a temperature differential between the heat-generating computing devices and the cooling apparatus, the liquid can continuously circulate, removing heat from the computing devices and delivering it to the cooling apparatus, without the consumption of electrical power. The cooling apparatus can be external to the data center, and can be cooled through heat radiation into the ambient air, thereby enabling the entire cooling apparatus to operate without the consumption of electrical power. A data center can also be cooled through geothermal cooling mechanisms, where the individual computing devices of such a data center are cooled through a thermally conductive interface with one or more heat pipes that can extend into the earth. Such heat pipes can transfer the heat from the computing devices of the data center to the earth without the consumption of electrical power. Alternatively, a data center can be cooled through geothermal cooling mechanisms, where the individual computing devices of such a data center are cooled through a thermally conductive interface with a liquid that can be actively pumped through conduits extending into the earth, thereby transferring heat from the computing devices of the data center to the earth. To avoid heat soak, such an embodiment can comprise multiple different sets of conduits extending into the earth, where at least some of those sets of conduits are not utilized for a period of time. Combinations of hydronic convection mechanisms and geothermal cooling can also be utilized to provide data center cooling. The cooling apparatus of the hydronic convection mechanisms can comprise geothermal heat pipes or multiple conduits comprising actively pumped liquid.

The techniques described herein make reference to specific environments and computing devices. For example, reference is made to data centers and the blade server computing devices typically found therein. Such references, however, are strictly exemplary and are made for ease of description and presentation, and are not intended to limit the mechanisms described to the specific environments and computing devices enumerated. Indeed, the techniques described herein are equally applicable, without modification, to any environment in which heat, generated by the processing of data in silicon-based processing units, is to be removed from multiple ones of such processing units.

Figure 1:
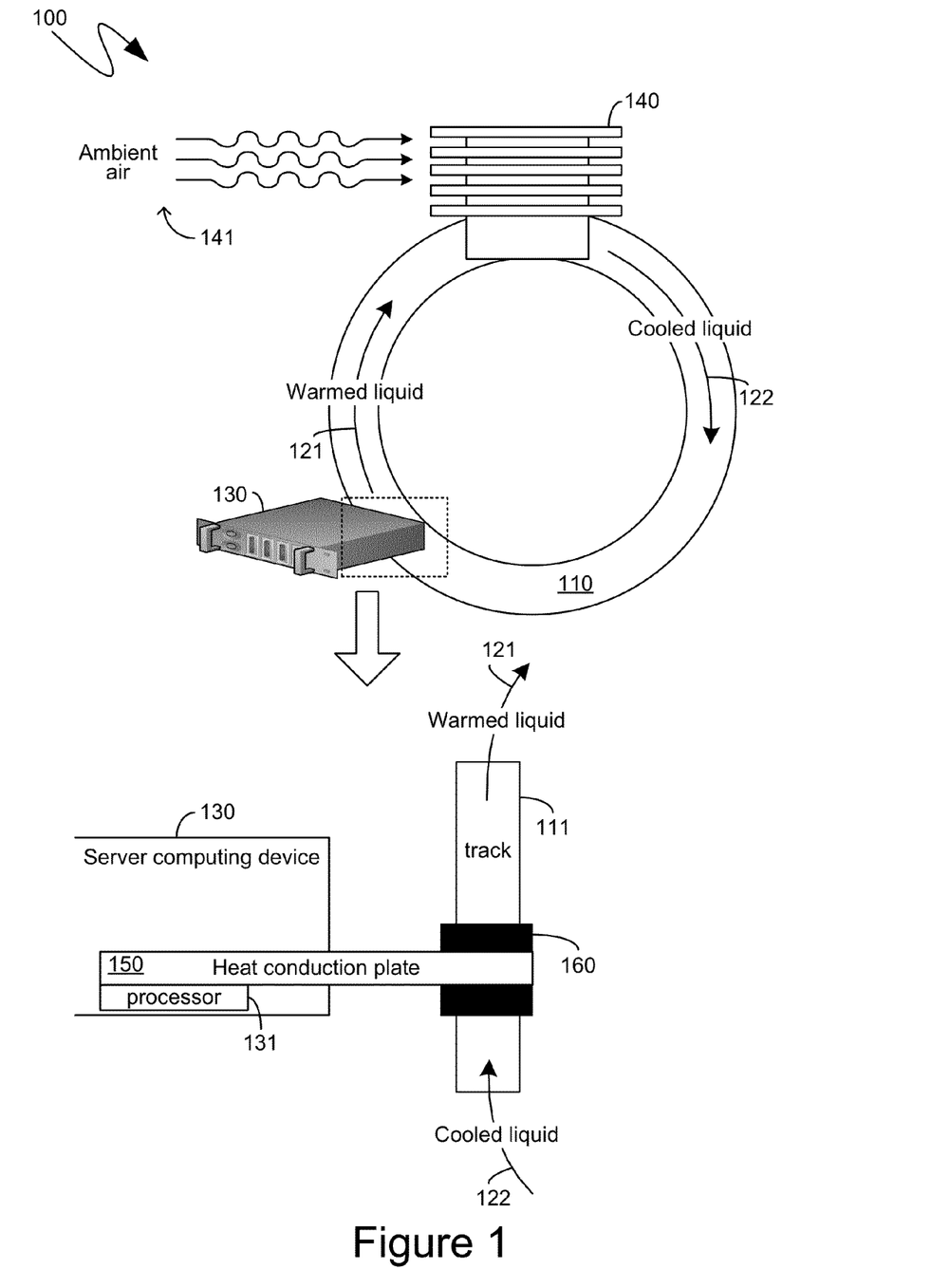
FIG. 1 is a block diagram of an exemplary hydronic convection cooling mechanism for a data center.

With reference to FIG. 1, an exemplary system 100 is shown therein providing hydronic convection cooling to one or more computing devices, such as in a data center context. More specifically, an exemplary blade server computing device 130 is illustrated as representative of the sorts of computing devices typically found by the hundreds, or thousands, in a single data center environment. Each such computing device can, as will be recognized by those skilled in the art, generate heat as part of the processing of data, by such a device, and other like useful operations. As will also be recognized by those skilled in the art, the individual processing units of such server computing devices typically operate optimally within a defined temperature range, and typically operate sub-optimally when the temperatures experienced by such processing units exceed the upper limits of the defined temperature range. Consequently, it can be desirable to remove, from the server computing devices, at least some of the heat generated by the data processing operations of such server computing devices.

One exemplary mechanism for removing heat from server computing devices, such as the exemplary server computing device 130 shown in the system 100 of FIG. 1, can be through the use of hydronic convection cooling. As illustrated by the system 100 of FIG. 1, the computing device 130 can comprise a thermal interface, described in further detail below, with a conduit 110 that can act as a conveyance for a liquid. Such a liquid can be water, or other like liquid, and can be either at atmospheric pressure, or at higher or lower pressures. The thermal interface between the computing device 130 and the conduit 110 can warm the liquid in the conduit 110, into the warmed liquid 121. As illustrated in FIG. 1, and as will be recognized by those skilled in the art, the warmed liquid 121 typically comprises a higher buoyancy and, consequently, will naturally tend to rise, within the conveyance 110.

In one embodiment, the conveyance 110 can comprise a thermal interface, not just with computing devices, such as the exemplary computing device 130, but also with a cooling apparatus 140, which can be positioned vertically higher than the computing devices. In such an embodiment, the warmed liquid 121, having been warmed by the thermal interface between the conduit 110 and the computing device 130, can rise, within the conduit 110, from the location of the interface between the conduit 110 and the computing device 130, to a higher location at which the conduit 110 comprises a thermal interface with the cooling apparatus 140. At such location, the warmed liquid 121 can be cooled, by the cooling apparatus 140, into the cooled liquid 122. As will also be recognized by those skilled in the art, the cooled liquid 122 can have a lower buoyancy than the warmed liquid 121 and, consequently, can descend within the conduit 110. Additionally, as the warmed liquid 121 rises within the conduit 110, it can create an area of lower pressure behind it, which can suck in the cooler liquid 122 from the lower portions of the conduit 110. In such a manner, the temperature differential between the computing device 130 and the cooling apparatus 140 can cause the liquid within the conduit 110 to cycle without any external pumping mechanisms, or other like energy consuming activities.

As illustrated by FIG. 1, the conduit 110 can be arranged in a circular arrangement, or other arrangement forming a continuous loop. Such an arrangement can facilitate the rising of the warmed liquid 121 and the descending of the cooled liquid 122 into the location from which it can be sucked back up, as the warmed liquid 121 rises, past the thermal interface between the conduit 110 and the computing device 130. In one embodiment, the computing devices to be cooled by the conduit 110, such as the exemplary server computing device 130, can be positioned, with respect to the conduit 110, at a location that is vertically above the lowest point of the conduit 110. Such an embodiment can facilitate the warmed liquid 121 rising along only one leg of the conduit 110, thereby encouraging the cyclical flow of the liquid within the conduit 110. Additionally, as will be described in further detail below, to facilitate flow of the liquid within the conduit 110, the conduit 110 can avoid configurations comprising sharp bends, angles, or other like changes in direction. Consequently, as also will be described in further detail below, the computing devices, such as within the data center, that can be cooled by such a hydronic convection cooling apparatus, can be oriented to support the above design optimizations.

In one embodiment, the cooling apparatus 140 can be a heat sink or other like cooling apparatus that achieves cooling functionality through the dissipation of heat into ambient air, such as the ambient air 141. In such an embodiment, the cooling apparatus 140 can be positioned externally to an enclosure, such as a data center, comprising the computing devices being cooled, such as exemplary computing device 130. For example, the cooling apparatus 140 can be positioned on the roof of such a data center, or can be positioned on a vertical structure extending from the roof of the data center. Because, in such an embodiment, the cooling apparatus 140 can facilitate cooling through the dissipation of heat into the ambient air, it can be desirable to increase the flow of ambient air, such as ambient air 141, through the fins, or other like physical constructs of the cooling apparatus 140. Energy consuming devices, such as fans, can be utilized to increase the flow of the ambient air 141 across the cooling apparatus 140, thereby increasing the cooling capacity of the cooling apparatus 140. Alternatively, the cooling apparatus 140 can be positioned in such a manner to increase the flow of the ambient air 141 across it. For example, the cooling apparatus 140 can be positioned at a vertical height that is above nearby structures that could block the flow of the ambient air 141 across the cooling apparatus 140. Thus, in an urban environment, the cooling apparatus 140 may need to be positioned at a vertically higher level than in rural environments having less structural impediments that can negatively impact the amount of ambient air 141 flowing across the cooling apparatus 140.

As indicated, the conduit 110 can be thermally coupled to the cooling apparatus 140, for purposes of removing heat from the warmed liquid 121, thereby generating the cold liquid 122, and the conduit 110 can be thermally coupled to the exemplary server computing device 130, for purposes of removing heat from the exemplary server computing device 130, by warming the cold liquid 122 into the warmed liquid 121. One exemplary thermal coupling between the exemplary server computing device 130 and the conduit 110 is illustrated in FIG. 1. More specifically, as shown in the lower half of FIG. 1, the server computing device 130 can comprise one or more processing units, such as exemplary processing unit 131, that can, as indicated previously, generate heat as a byproduct of data processing. In one embodiment, a heat conduction plate, such as the exemplary heat conduction plate 150, can be thermally coupled to the processor 131, such as by being physically joined with it through a thermal paste or other like facilitator for passing heat generated by the processor 131 to the heat conduction plate 150.

The heat conduction plate 150 can then, in one embodiment, protrude beyond the physical boundaries of the server computing device 130 and can be thermally coupled to a track 111 that can be part of the conduit 110, such as an individual pipe, or other like fluid carrying member, of the conduit 110. The thermal coupling 160 between the heat conduction plate 150 and the track 111 can be based on any number of thermal transfer mechanisms. For example, the heat conduction plate 150 can wrap around the track 111 one or more times, thereby facilitating the transfer of thermal energy from heat conduction plate 150 to the track 111 as a result of the increased mating surfaces therebetween. As another example, the track 111 can wrap one or more times around the heat conduction plate 150, again increasing the mating surfaces between the heat conduction plate 150 and the track 111. As another example, the thermal coupling 160 can comprise a thermal paste or other like facilitator for exchanging thermal energy between the heat conduction plate 150 and the track 111 when the two are physically proximate to one another, such as touching one another along a physical interface formed therebetween. Other like thermal couplings are also intended to be represented by the exemplary thermal coupling 160.

As will be recognized by those skilled in the art, computing devices, such as the exemplary server computing device 130, are typically arranged in vertical racks in datacenters. In such a manner, increased utilization of the space in the data center can be achieved, as the racks of server computing devices can extend along two dimensions in the horizontal direction, and the orientation of the individual server computing devices, within any one of those racks, can extend along the third, vertical, dimension. However, in one embodiment, a single loop of the conduit 110 can be thermally coupled to a single computing device, or a single source of thermal energy transfer between one or more computing devices and that single loop. Consequently, the server computing devices in a rack can share a single thermal coupling with a loop of the conduit 110. For example, heat conduction plates from multiple ones of the server computing devices in a single rack can extend from physical boundaries of those server computing devices to a single location at which they can all be thermal coupled together with a single loop of the conduit 110. Alternatively, multiple loops of the conduit 110 can exist, such that each server computing device can be thermally coupled to its own loop.

Figure 2:
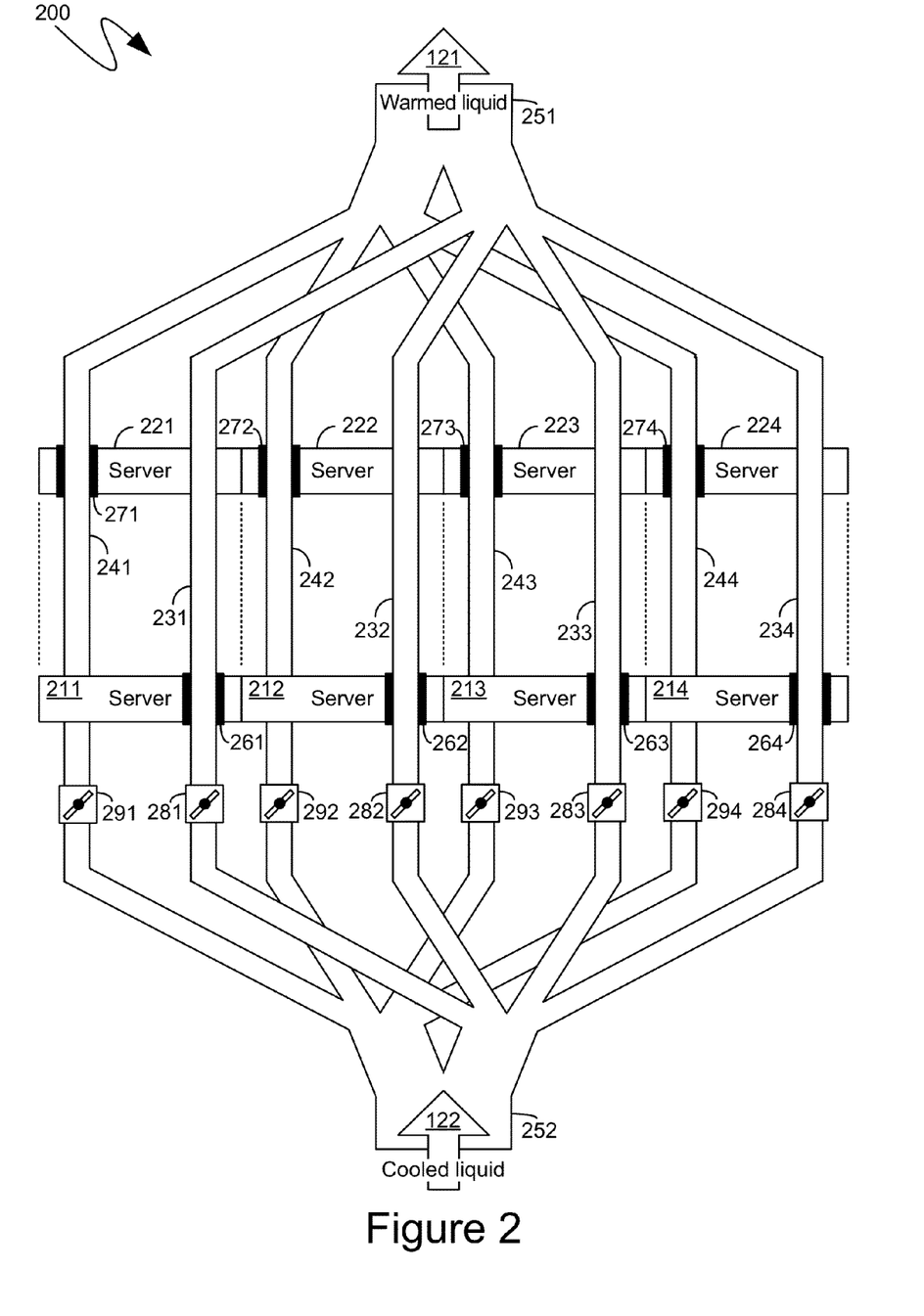
FIG. 2 is a block diagram of another aspect of an exemplary hydronic convection cooling mechanism for a data center.

Turning to FIG. 2, the system 200 shown therein illustrates an exemplary piping that can represent a portion of the conduit 110 that was illustrated in FIG. 1. More specifically, the system 200 of FIG. 2 can comprise multiple server computing devices, namely the server computing devices 211, 212, 213, 214, 221, 222, 223 and 224, which can represent a portion of the server computing devices in environments such as a data center. The server computing devices can be arranged in racks such that, for example, the server computing device 221 can be located above and in the same rack as the server computing device 211, the server computing device 222 can be located above and in the same rack as the server computing device 212, the server computing device 223 can be located above and in the same rack as the server computing device 213, and the server computing device 224 can be located above and in the same rack as the server computing device 214.

As illustrated in FIG. 2, the conduit 110 can be split into multiple individual tracks or capillaries, such as individual pipes or other like fluid carrying members, that can create individual loops to provide hydronic convection cooling to individual computing devices. For example, a large diameter "header", or "trunk", of the conduit 110 is represented in FIG. 2 by the header 252. Such a header 252 can then be split into multiple tracks or capillaries, such as the tracks 231, 232, 233, 234, 241, 242, 243 and 244. The tracks 231, 232, 233, 234, 241, 242, 243 and 244 can be routed proximate to the server computing devices 211, 212, 213, 214, 221, 222, 223 and 224, thereby facilitating thermal couplings between such tracks and such server computing devices. Subsequently, to facilitate passage of the warmed liquid 121 to a cooling apparatus, such as that described above, the multiple tracks 231, 232, 233, 234, 241, 242, 243 and 244 can be joined back together to form the header 251 which can then route the warmed liquid 121 to a cooling apparatus, where such warmed liquid 121 can be cooled into the cooled liquid 122, and then connected and routed back to the header 252, such as in the manner illustrated by the conduit 110 shown in FIG. 1. In one embodiment, the headers, such as the headers 251 and 252 can be sized so as to provide sufficient fluid and drive forces to enable and support the movement of a sufficient quantity of fluid past the servers to effectively cool the servers. Similarly, the tracks or capillaries can be sized to be sufficiently small to reduce flow and preserve convection forces forcing the fluid past the each individual server. In such a manner, a sufficiently great temperature differential between the servers and the fluid in the tracks can be maintained to provide for effective cooling.

Although illustrated in FIG. 2 as comprising sharp edges, in one embodiment, the pipes or other like fluid carrying members implementing the tracks 231, 232, 233, 234, 241, 242, 243 and 244, and the connections between such tracks in the headers 251 and 252, can be designed, oriented and coupled so as to minimize sharp turns, edges, splits, or other like turbulence inducing routings. By splitting the header 252 into the tracks 231, 232, 233, 234, 241, 242, 243 and 244, each of the server computing devices 211, 212, 213, 214, 221, 222, 223 and 224 can be thermally coupled with its own loop of the conduit 110. For example, the server computing device 211 is illustrated as comprising a thermal coupling 261 between such a computing device in the track 231 that can be designed and installed to pass proximate thereto. In one embodiment, the thermal coupling 261 can utilize a heat conduction plate, such as the heat conduction plate 150 illustrated in FIG. 1. The cooled liquid 122 can, thereby, via the header 252, and, subsequently, the track 231, flow past the server computing device 211, accepting heat therefrom and, thereby, cooling the server computing device 211. The resulting warmed liquid 121 can, then, rise along the track 231 to the header 251 where it can be routed past a cooling apparatus, and then looped back down to join the header 252. In a similar manner, the track 232 can pass proximate to the server computing device 212, and can share a thermal coupling 262 with the server computing device 212. The tracks 233 and 234, analogously, can pass proximate to the server computing devices 213 and 214, respectively, and can share thermal couplings 263 and 264, respectively, with such server computing devices.

To provide for individual cooling loops for a subsequent layer of server computing devices, such as for server computing devices located above the aforementioned server computing devices in racks, additional tracks can be split from the header 252. For example, the track 241 can bypass the lower server computing device 211 and can, instead, be positioned proximate to a server computing device 221 that can be located above the server computing device 211, such as in a racked arrangement. The track 241 can, then, comprise a thermal coupling 271 with the server computing device 221. As before, the thermal coupling 271 can utilize a heat conduction plate, such as the heat conduction plate 150 illustrated in FIG. 1. The cooled liquid 122 can, thereby, via the track 241, flow past the server computing device 221, excepting heat therefrom, and turning into the warmed liquid 121 which can be delivered, via the header 251, to a cooling apparatus to be cooled back into the cold liquid 122, which can then be delivered back to the track 241 via the header 252. In such a manner, the track 241 can represent a portion of a loop of a conduit that can be thermally coupled only to the server computing device 221 to the exclusion of other server computing devices, such as, for example, other server computing devices from the same rack as the server computing device 221. In a similar manner, the server computing device 222, which can be part of the same rack server computing devices as the server computing device 212, can comprise a thermal coupling 272 with a track 242 that can comprise no other thermal couplings. In a similar manner, tracks 243 and 244 can be routed past the server computing devices 223 and 224, respectively, and can be thermally coupled thereto, such as via the thermal couplings 273 and 274, respectively. In such a manner, individual loops of a conduit can be provided for individual ones, or individual collections of multiple ones of the server computing devices in a data center.

Additionally, in one embodiment, one or more of tracks can comprise valves for preventing the flow of the liquid through such tracks. For example, as illustrated by the system 200 of FIG. 2, the track 231 can have a valve 281 that can shut off liquid flow through the track 231. Such a valve 281 can be utilized to enable replacement of the server computing device 211 should the thermal coupling 261 between the server computing device 211 and the track 231 be such that the flow of liquid through the track 231 needs to be stopped prior to a disconnection of the computing device 211 from the track 231. Alternatively, or in addition, such a valve 281 can be utilized to direct the fluid to computing devices that require a greater amount of cooling, and direct the fluid away from computing devices that do not require cooling, or require reduced amounts of cooling. Additional valves 282, 283, 284, 291, 292, 293 and 294 are illustrated in FIG. 2 as corresponding to tracks 232, 233, 234, 241, 242, 243 and 244, respectively. Additionally, in one embodiment, a second set of valves, not illustrated in FIG. 2, can be positioned between header 251 and the interfaces between the server computing devices and the corresponding tracks to prevent the backflow of liquid.

Figure 3:
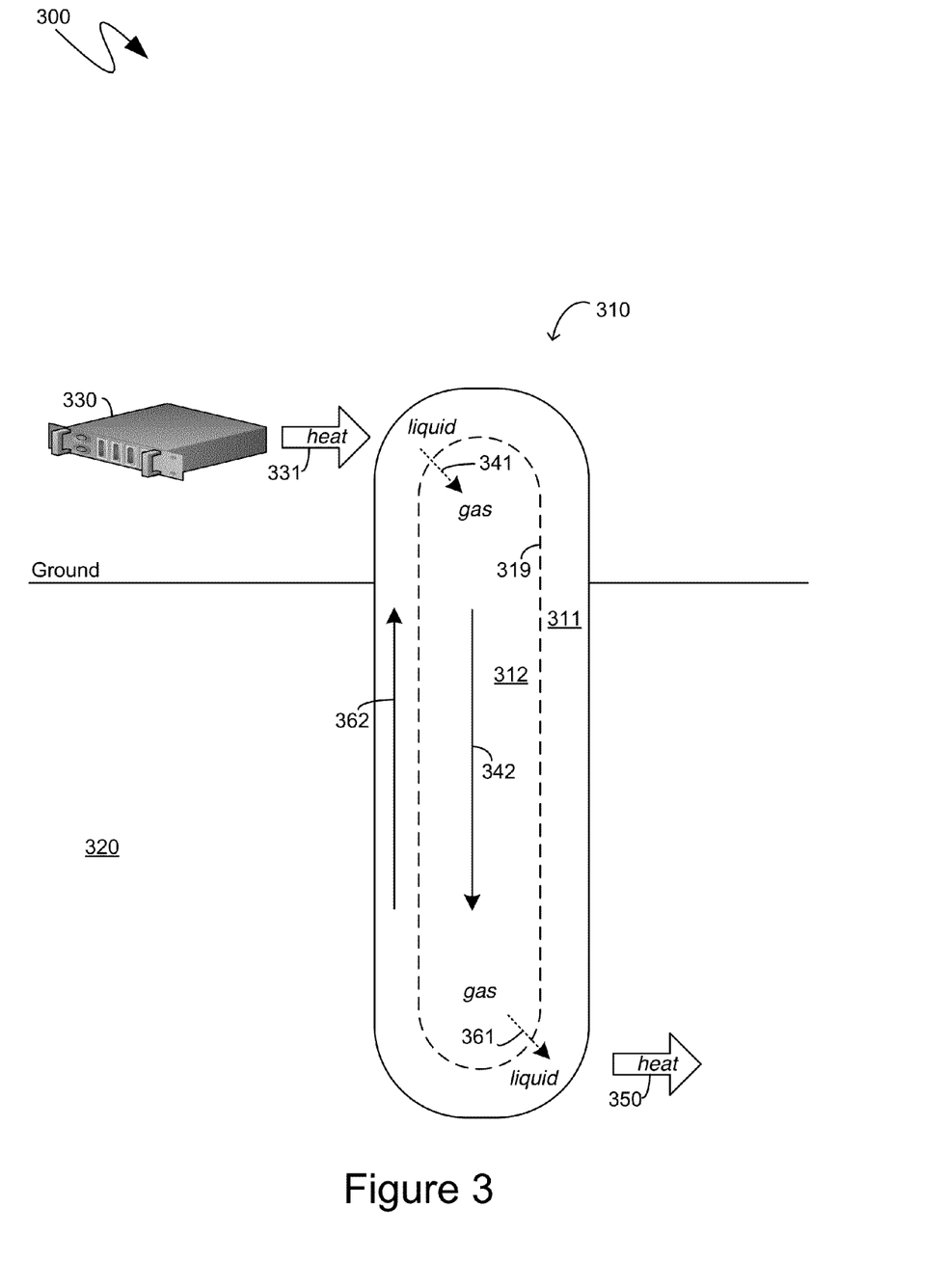
FIG. 3 is a block diagram of an exemplary geothermal cooling mechanism for a data center.

Turning to FIG. 3, in another embodiment, a heat pipe, such as the exemplary heat pipe 310, can be utilized to remove heat 331 from an exemplary server computing device 330 to the earth 320, thereby utilizing geothermal properties to cool server computing devices, such as exemplary server computing device 330. More specifically, and as illustrated by the system 300 of FIG. 3, a heat pipe 310 can comprise an intermediate portion 311 that can be defined by the exterior boundaries of the heat pipe 310 and by an interior permeable membrane 319. Typically, as only recognized by those skilled in the art, the intermediate portion 311 can be a wick or other like material that can absorb a liquid and can enable the liquid to flow through it. The heat pipe 310 can further comprise an interior cavity 312 that can provide for the free movement of gas within such an interior cavity 312. As will be understood by those skilled in the art, a heat pipe, such as the exemplary heat pipe 310, can absorb heat, such as the heat 331 being generated by the exemplary server computing device 330, and, by absorbing such heat, a liquid in the heat pipe can boil and be converted to a gas, as illustrated by the boiling action 341. As part of the boiling action 341, the liquid can leave the intermediate portion 311, of the heat pipe 310, and can escape into the interior cavity 312, where such gas can move to an opposite end of the heat pipe 310, since such an opposite end of the heat pipe that can have a lower pressure. The movement of gas within the interior cavity 312 is illustrated by the arrow 342 in FIG. 3. The heat from the gas can escape the heat pipe 310, as the heat 350, causing the gas to condense back to a liquid, as illustrated by the condensation action 361. Such a liquid can then be reabsorbed by the intermediate portion 311 of the heat pipe 310. Simultaneously, the boiling of liquid to a gas, as illustrated by the boiling action 341, can result in an area of lower pressure in the intermediate portion 311, which can cause liquid to flow into that area, as illustrated by the arrow 362. Those of skill in the art will recognize that the movement of the liquid illustrated by the arrow 362 can be due to an effect known as "capillary action". Such liquid that has flowed up into the area proximate to the exemplary server computing device 330 can then, again, be heated by the heat 331, such as from the exemplary computing device 330, and the above described process can loop, thereby transferring the heat 331, from the server computing device 330, to the ground 320, in the form of heat 350. As can be seen, due to the pressures created by the evaporating and then condensing liquid in a heat pipe, such as the heat pipe 310, the heat pipe can operate independently of, and, indeed, against gravity. For example, the exemplary heat pipe 310, shown in FIG. 3, is illustrated as absorbing the heat 331 at a vertically high point of the heat pipe 310 and then releasing such heat, in the form of heat 350, at a vertically low point of the heat pipe 310.

Although not specifically illustrated in FIG. 3, a thermal coupling can exist between the exemplary server computing device 330 and the exemplary heat pipe 310, and can facilitate the transfer of the heat 331 from the exemplary server computing device 330 to the exemplary heat pipe 310. In one embodiment, such a thermal coupling can comprise a heat conduction plate, such as the exemplary heat conduction plate 150 illustrated in FIG. 1. A thermal coupling can also exist at the other end of the exemplary heat pipe 310 to facilitate the transfer of the heat 350 from the heat pipe 310 into the ground 320. More specifically, as will be known to those skilled in the art, beyond a threshold depth, the temperature of the ground 320 can remain relatively constant, and can maintain a temperature below that of the processing components of the exemplary server computing device 330. Consequently, the ground 320 can absorb the heat 350 being provided by the exemplary heat pipe 310. In one embodiment, the thermal coupling between the ground 320 and the exemplary heat pipe 310 can be nothing more than the physical connection therebetween. Consequently, specific types of ground 320 can be more efficient at absorbing the heat 350. For example, sandy or rocky ground can comprise small air pockets between the individual particles of sand or rocks, and each of such air pockets can act as insulators impeding the transfer of the heat 350. By contrast, muddy ground, or ground having a high water table, can establish continuous physical contact between itself and the exemplary heat pipe 310 and can, thereby, absorb and dissipate the heat 350 more efficiently. Consequently, in one embodiment, installation of geothermic cooling mechanisms, such as those described herein, can be dependent upon the type of ground on which a data center is situated.

As will be understood by those skilled in the art, the ground 320 does not comprise an infinite capability to absorb heat. Consequently, if too much heat 350 is provided to the ground 320 too quickly a condition known as "heat soak" can develop, whereby the ground 320 immediately surrounding the heat pipe 310 becomes too hot to accept any further heat 350, since such ground 320 immediately surrounding the heat pipe 310 is not being afforded sufficient time to dissipate the heat 350 being provided by the heat pipe 310. In one embodiment, the heat pipe 310 can be designed to avoid such heat soak. In particular, a heat pipe, such as exemplary heat pipe 310, can transfer heat at a constant temperature. Such a temperature can be determined based upon the vacuum or pressure in the heat pipe 310, as well as the liquid utilized. Consequently, the heat pipe 310 can be designed to operate at such a temperature that the ground 320 can dissipate the heat 350, and avoid heat soak. The ability to avoid heat soak through heat pipe design can also aid in obtaining the relevant approvals, such as from public and environmental agencies, to construct and utilize such cooling mechanisms.

Figure 4:
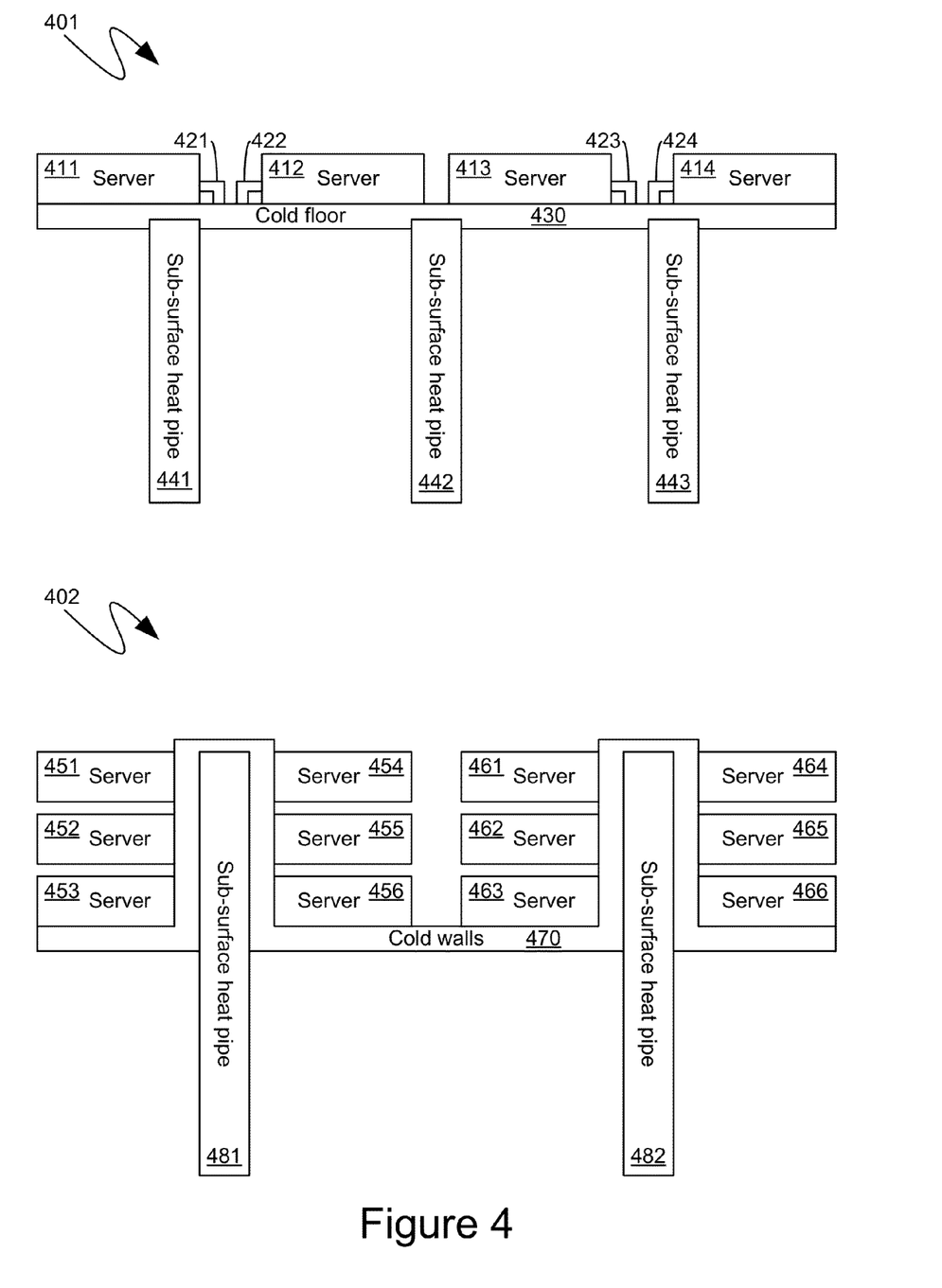
FIG. 4 is a block diagram of another aspect of an exemplary geothermal cooling mechanism for a data center.

Turning to FIG. 4, the systems 401 and 402 illustrate exemplary embodiments for the implementation of geothermal cooling in a data center context. Turning first to the system 401, the server computing devices 411, 412, 413 and 414 are illustrated as being in proximity to, and thermally coupled to a cold floor 430. The cold floor 430 can then, also, be thermally coupled to one or more subsurface heat pipes, such as the exemplary subsurface heat pipes 441, 442 and 443. For example, the cold floor 430 can comprise a thermally conductive material, such as a metal like copper. The thermal coupling between such a cold floor 430, and one or more of the sub surface heat pipes 441, 442 and 443, can be nothing more than the physical connection between. Alternatively, the thermal coupling between a cold floor, such as the cold floor 430, and one or more of the sub surface heat pipes 441, 442 and 443, can be facilitated by a thermal paste, or other like thermal transfer facilitator, applied between them.

Similarly, in one embodiment, a thermal coupling between one or more of the server computing devices 411, 412, 413 and 414 can be nothing more than the physical connection between them. For example, internally, each of the server computing devices 411, 412, 413 and 414 can be constructed such that the base of such computing devices acts as a thermal transfer mechanism, such as a heat sink, for the processors of such computing devices. As one example, the circuit board of such computing devices can be oriented such that the processors on the bottom side of the circuit board are in physical contact with a base of such computing devices, the contact between the processors and the base acting as a thermal coupling between. Subsequently then, each of the server computing devices 411, 412, 413 and 414 can be positioned on the cold floor 430 such that the base of such server computing devices 411, 412, 413 and 414 is directly in contact with the cold floor 430, thereby providing a thermal coupling between the server computing devices 411, 412, 413 and 414 and the cold floor 430. In other embodiments, thermal paste, or other like thermal transfer facilitators, can be applied between the aforementioned surfaces to further increase thermal transfer.

Alternatively, in another embodiment, the server computing devices 411, 412, 413 and 414 can comprise heat conduction plates, such as the exemplary heat conduction plate 150 illustrated in FIG. 1. Such heat conduction plates can then be thermally coupled to the cold floor 430. For example, as illustrated in the exemplary system 401 of FIG. 4, the server 411 can comprise a heat conduction plate 421 thermally coupled to both one or more processing units of the server computing device 411 and the cold floor 430. Servers 412, 413 and 414 can, and analogously, comprise heat conduction plates 422, 423 and 424, which can be thermally coupled to one or more processing units of those server computing devices and the cold floor 430.

In the embodiment illustrated by the system 401 of FIG. 4, the server computing devices can be arranged directly on the floor of the data center. In another embodiment, a three-dimensional orientation of server computing devices can be utilized, and forced air can be routed through the cold floor 430 and then up past stacked server computing devices, such as in a vertical, rack arrangement. In such an embodiment, a high airflow rate may be necessary due to potentially small temperature differentials between the sub-surface heat pipe cooled cold floor 430 and the temperatures of the server computing devices themselves.

An alternative embodiment, providing for a three-dimensional orientation of server computing devices, including the stacking of server computing devices in a vertical direction, is illustrated by the system 402 of FIG. 4. More specifically, the system 402 comprises subsurface heat pipes 481 and 482 which, instead of being thermally coupled to a cold floor, such as the cold floor 430, can, instead, extend above the floor and can be thermally coupled to cold walls 470 in which the subsurface heat pipes 481 and 482 can be positioned. The individual server computing devices such as, for example, the exemplary server computing devices 451, 452, 453, 454, 455, 456, 461, 462, 463, 464, 465 and 466 can then be thermally coupled to one or more of the cold walls 470. As utilized herein, the term "cold wall" means any surface area having a sufficient width and/or height so as to be able to support, touch, or commune with at least a sufficient amount of multiple computing devices so as to enable the transfer of thermal energy from such multiple computing devices to the surface.

In one embodiment, one or more of the server computing devices 451, 452, 453, 454, 455, 456, 461, 462, 463, 464, 465 and 466 can comprise either internal or external mechanisms for transferring thermal energy from one or more of the processing units of such server computing devices to a side or back panel of such server computing devices that can be positioned against a wall. For example, a server computing device could comprise internal heat sinks or heat conduction plates that can be in physical contact with both the processing units and a side or back panel of such a server computing device. Subsequently, the computing devices 451, 452, 453, 454, 455, 456, 461, 462, 463, 464, 465 and 466 can be positioned against one or more of the cold walls 470, thereby establishing a thermal coupling between the computing device and the cold wall. As before, the physical connection between a server computing device and one or more of the cold walls 470 can comprise a thermal paste or other like facilitator for transferring thermal energy from the server computing device to one or more of the cold walls 470. In such a manner, the server computing devices, as illustrated by the system 402 of FIG. 4, can both be laid out in the two horizontal directions, and can also be stacked in the vertical direction, such as on racks.

Figure 5:
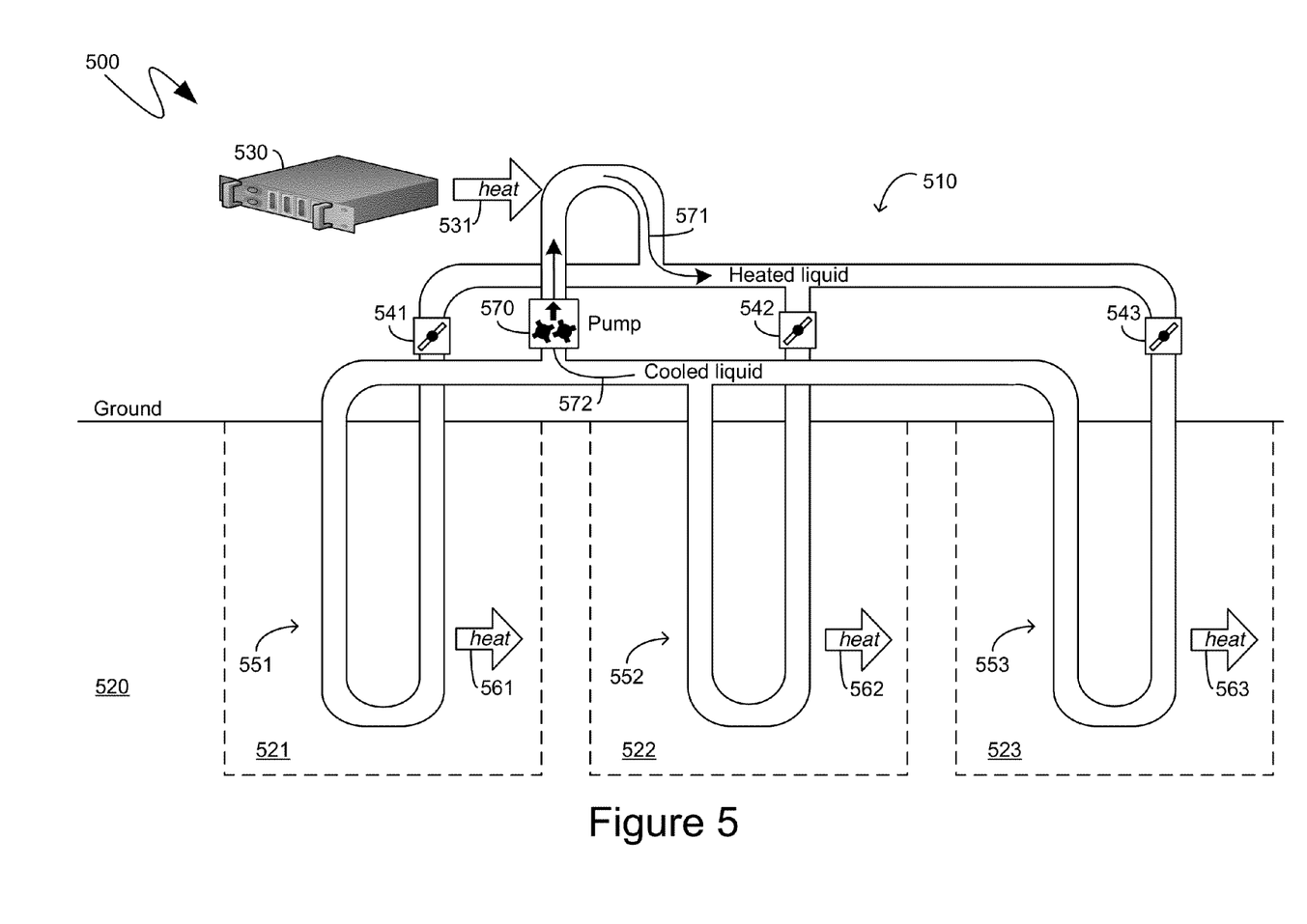
FIG. 5 is a block diagram of another exemplary geothermal cooling mechanism for a data center.

Turning to FIG. 5, system 500 shown therein illustrates an alternative geothermal cooling mechanism that can be applied to the computing devices of a data center. More specifically, the piping 510 need not be a heat pipe, and can, instead, be piping carrying a liquid that can transfer the heat 531, such as from an exemplary server computing device 530, to the ground 520. Because the piping 510 need not operate at a constant temperature, a possibility of heat soak exists. Consequently, in one embodiment, discrete loops of conduit can be utilized to establish discrete zones, within the ground 520, that can be alternatively activated and deactivated, thereby accounting for heat soak. More specifically, and as illustrated by the system 500 of FIG. 5, a server computing device, such as exemplary server computing device 530, can comprise a thermal coupling between itself and a portion of the piping 510 whereby heat 531 can be transferred from the server computing device 530 to the piping 510. Such a thermal coupling can include any of the above described thermal couplings including, for example, the heat conduction plate illustrated in FIG. 1 and described in detail above. As a result of such a thermal coupling between the exemplary server computing device 530 and the piping 510, a cooled liquid 572, carried in the piping 510, can absorb the heat 531, from the server computing device 530, and can become the heated liquid 571. A pump 570, or other like liquid conveyance mechanism, can cause the heated liquid 571 to be moved along the piping 510 down into the ground 520, where such heated liquid 571 can be cooled via the thermal coupling between the ground 520 and the piping 510.

In one embodiment, the path taken by the heated liquid 571 can be selectively altered by one or more valves or other flow controlling devices. The valves 541, 542 and 543, illustrated in the system 500 of FIG. 5, for example, can control the flow of the heated liquid 571 in the piping 510. For example, if the valve 543 is open, the heated liquid 571 can flow through the portion 553 of the piping 510 and can enable a portion 523 of the ground 520 to absorb the heat 563. By contrast, if the valve 543 is closed, but the valve 542 is open, than the heated liquid 571 can flow through the portion 552 of the piping 510 and can enable a portion 522 of the ground 520 to absorb the heat 562. In a similar manner, the valve 541 can control the flow of the heated liquid 571 through the portion 551 of the piping 510, thereby controlling whether or not the portion 521 of the ground 520 absorbs the heat 561. In such a manner, valves, such as the valves 541, 542 and 543, can define zones of the piping 510, such as the zones defined by the portions 551, 552 and 553 of the piping 510, that can cause different zones of the ground 520, such as the portions 521, 522 and 523 of the ground 520, respectively, to absorb heat. Therefore, in one embodiment, to minimize heat soak, at least one of the zones defined by the portions 551, 552 and 553 of the piping 510 can remain inactive, and one of the corresponding valves 541, 542 and 543, respectively, can remain closed, thereby preventing the flow of the heated liquid 571 through a corresponding portion of the piping 510. For example, during one period of time, only the valve 541 can be open, thereby enabling the heated liquid 571 to flow only through the portion 551 of the piping 510, thereby heating up the portion 521 of the ground 520. When the portion 521 of the ground 520 experiences heat soak, the valve 541 can be closed, and the valve 542 can be open. At that time, then, the heated liquid 571 can flow only through the portion 552 of the piping 510, thereby heating up the portion 522 of the ground 520. When that portion 522 of the ground 520 experiences heat soak, the valve 542 can be closed, and the valve 543 can be open. Designed properly, by the time the portion 523 of the ground experiences heat soak, the portion 521 can have dissipated the heat 561 previously dumped into it, and the valve 543 can be closed, and the valve 541 can be opened again. In such a manner, an actively pumped cooling apparatus can still take advantage of geothermal cooling while minimizing heat soak through the use of multiple zones.

Although not specifically illustrated in the Figures, the multi-zone piping system 500 of FIG. 5 can provide thermal transfer capabilities analogous to the sub-surface heat pipes of the systems 401 and 402. Consequently, in an embodiment analogous to that illustrated by the system 401 of FIG. 4, and described in detail above, the multi-zone piping system 500 of FIG. 5 can be thermally coupled to a cold floor, such as the cold floor 430 of FIG. 4, and can, thereby, cool one or more computing devices, such as the exemplary server computing devices 411, 412, 413 and 414 of the system 401 of FIG. 4. Similarly, in an embodiment analogous to that illustrated by the system 402 of FIG. 4, and described in detail above, the multi-zone piping system 500 of FIG. 5 can be thermally coupled to cold walls, such as the cold walls 470 of FIG. 4, and can, thereby, cool one or more computing devices, such as the exemplary server computing devices 451, 452, 453, 454, 455, 456, 461, 462, 463, 464, 465 and 466 of the system 402 of FIG. 4.

In one embodiment, two or more of the above-described mechanisms can be combined within a single data center. For example, and with reference to the exemplary system 600 shown in FIG. 6, the previously described hydronic convection cooling can be combined with the previously described geothermal cooling such as in the manner illustrated. For example, the above referenced server computing device 130, having a thermal coupling with the conduit 110 of the hydronic convection cooling system 100 of FIG. 1, can warm a liquid within the conduit 110, causing the warmed liquid 121 to rise to a high point of the conduit 110. In the exemplary embodiment illustrated by the system 600 of FIG. 6, a sub-surface heat pipe, such as the exemplary subsurface heat pipe 310 originally illustrated in FIG. 3, can comprise a thermal coupling 610 between it and the conduit 110. Such a thermal coupling 610 can enable the transfer of thermal energy from the warmed liquid 121 to the subsurface heat pipe 310. The warm liquid 121, having been cooled by the subsurface heat pipe 310, can then descend, within the conduit 110, as the cooled liquid 122, such as in the manner described previously. Similarly, the subsurface heat pipe 310 can, in the manner described in detail above, transfer the heat obtained from the warmed liquid 121 to the ground 620, as the heat 630 shown in FIG. 6. In such an embodiment, the subsurface heat pipe 310, and thermal conduit 610, can act as the cooling apparatus 140 of the system 100 shown in FIG. 1, described in detail above. Consequently, such an embodiment can be useful for data center locations where easy access to ambient air, such as on the roof, may not be available. For example, the embodiment illustrated by the system 600 of FIG. 6 can be useful in situations where data centers are located on a lower floor of a multistory building, such that there are additional floors above the data center.

Figure 6:
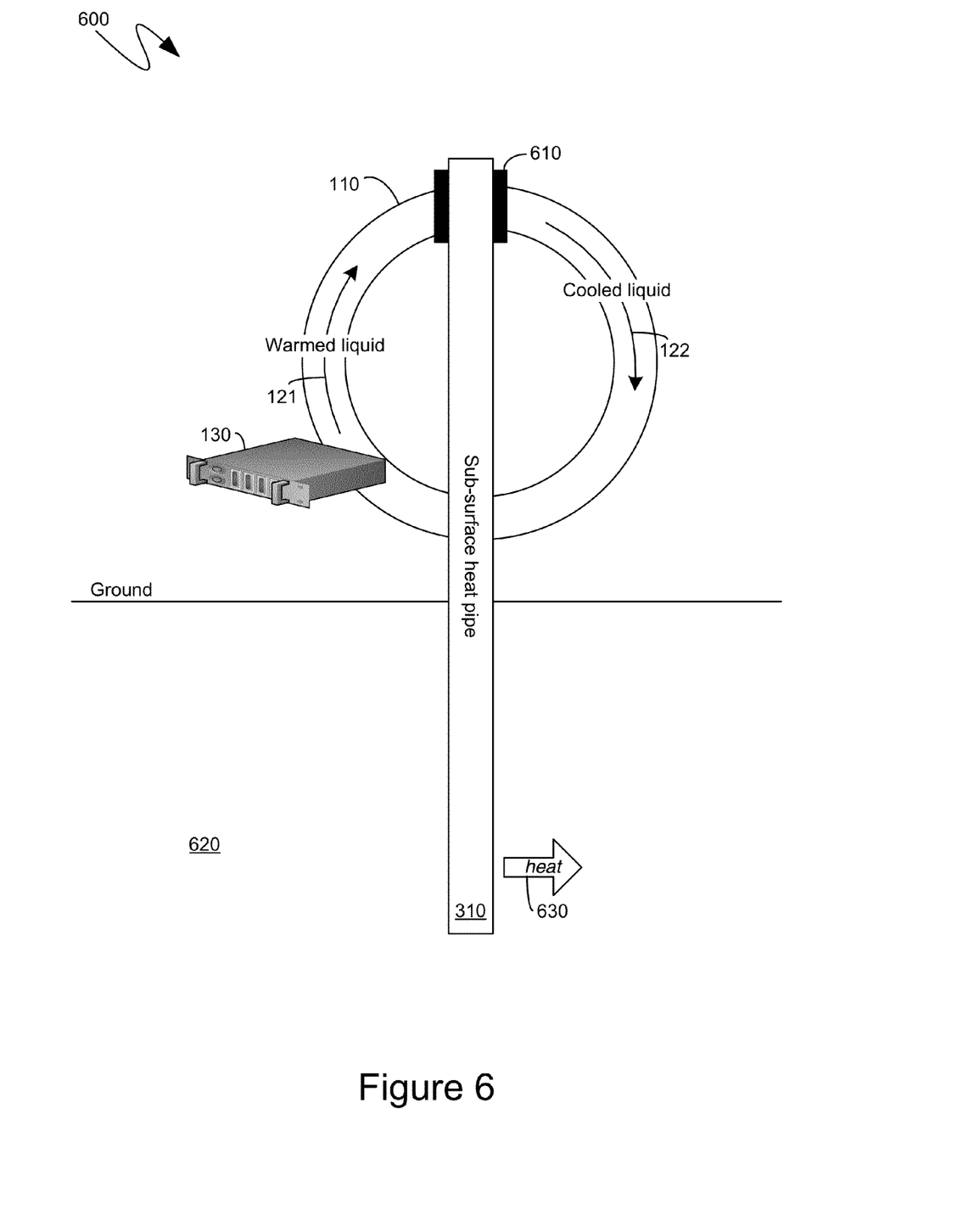
FIG. 6 is a block diagram of an exemplary hydronic convection cooling and geothermal cooling mechanism for a data center.

In another embodiment, the subsurface heat pipe 310, shown in the system 600 of FIG. 6, can be replaced by the piping 510 of the multi-zone geothermal cooling apparatus shown in FIG. 5. Still other combinations of the above described mechanisms are equally possible.

As can be seen from the above descriptions, renewable energy based data center cooling mechanisms have been presented. Which, in view of the many possible variations of the subject matter described herein, we claim as our invention all such embodiments as may come within the scope of the following claims and equivalents thereto.

We claim:

1. A system for simultaneously cooling multiple computing devices, the system comprising:
   a multi-zone piping system comprising:
      a first distinct portion extending below ground into a first portion of the earth;
      a first valve controlling the flow of heated liquid into the first distinct portion of the multi-zone piping system;
      a second distinct portion extending below ground into a second portion of the earth that is different and separate from the first portion; and a second valve controlling the flow of the heated liquid into the second distinct portion of the multi-zone piping system;
      wherein the first and second valves alternate which of the first distinct portion of the multi-zone piping system and the second distinct portion of the multi-zone piping system have the heated liquid flowing through them so as to avoid heat soak of the first portion and the second portion of the earth;
   a surface that is thermally coupled to the multi-zone piping system such that thermal energy is passed through the surface into the multi-zone piping system, the surface comprising at least one of a cold floor or a cold wall; and
   a thermal coupling between the multiple computing devices and the surface, the multiple computing devices being arranged so as to facilitate the thermal coupling between them and the surface.

2. The system of claim 1, wherein the surface is the cold floor; and wherein further the thermal coupling between the multiple computing devices and the cold floor comprises a physical touching between the cold floor and a bottom of at least some of the multiple computing devices, at least some of the multiple computing devices being arranged adjacent to one another on the cold floor.

3. The system of claim 1, wherein the surface is the cold wall; and wherein further the thermal coupling between the multiple computing devices and the cold wall comprises a physical touching between the cold wall and a side of at least some of the multiple computing devices, at least some of the multiple computing devices being arranged vertically stacked one on top of another against the cold wall.

4. The system of claim 1, wherein the thermal coupling between the multiple computing devices and the surface comprises a heat conduction plate extending from inside of at least some of the multiple computing devices to the surface.

5. The system of claim 1, wherein the thermal coupling between the multiple computing devices and the surface comprises a single first thermal coupling between the surface and at least two of the multiple computing devices and a single second, different thermal coupling between the surface and at least two other of the multiple computing devices.

6. The system of claim 1, wherein the first distinct portion and the second distinct portions are heat pipes comprising a liquid that evaporates to absorb thermal energy and then condenses to release the thermal energy, the release of the thermal energy being into the earth below the ground.

7. The system of claim 1, further comprising:
   a conduit carrying a liquid;
   a second thermal coupling between the conduit and the multiple computing devices, the second thermal coupling causing the liquid to warm, the warm liquid then rising within the conduit;
   a cooling apparatus located physically higher than the multiple computing devices;
   a third thermal coupling between the conduit and the cooling apparatus, the third thermal coupling causing the warm liquid to cool, the cool liquid then descending within the conduit;
   wherein the cool liquid is drawn, within the conduit, past the second thermal coupling between the conduit and the multiple computing devices as a consequence of the warm liquid rising within the conduit.

8. The system of claim 7, wherein the cooling apparatus is thermally coupled to the multi-zone piping system.

9. A geothermal cooling system comprising:
   a first heat pipe extending below ground into a first portion of the earth;
   a second heat pipe, physically distinct from the first heat pipe, the second heat pipe extending below ground into a second portion of the earth that is different and separate from the first portion; and
   one or more computing devices alternatingly being thermally coupled, either to the first heat pipe, to the exclusion of being thermally coupled to the second heat pipe, or to the second heat pipe, to the exclusion of being thermally coupled to the second heat pipe, so as to avoid heat soak.

10. The geothermal cooling system of claim 9, further comprising:
    a first valve controlling a first flow of liquid into the first heat pipe and thereby controlling a first thermal coupling between the one or more computing devices and the first heat pipe; and
    a second valve controlling a second flow of liquid into the second heat pipe and thereby controlling a second thermal coupling between the one or more computing devices and the second heat pipe.

11. The geothermal cooling system of claim 9, further comprising a surface that is thermally coupled to both the first heat pipe and the second heat pipe.

12. The geothermal cooling system of claim 11, wherein the surface is the cold floor; and wherein further the thermal coupling between the one or more computing devices and the cold floor comprises a physical touching between the cold floor and a bottom of at least some of the one or more computing devices, at least some of the one or more computing devices being arranged adjacent to one another on the cold floor.

13. The geothermal cooling system of claim 11, wherein the surface is the cold wall; and wherein further the thermal coupling between the one or more computing devices and the cold wall comprises a physical touching between the cold wall and a side of at least some of the one or more computing devices, at least some of the one or more computing devices being arranged vertically stacked one on top of another against the cold wall.

14. The geothermal cooling system of claim 11, wherein the thermal coupling between the one or more computing devices and the surface comprises a heat conduction plate extending from inside of at least some of the one or more computing devices to the surface.

15. The geothermal cooling system of claim 11, wherein the thermal coupling between the one or more computing devices and the surface comprises a single first thermal coupling between the surface and at least two of the one or more computing devices and a single second, different thermal coupling between the surface and at least two other of the one or more computing devices.

16. The geothermal cooling system of claim 9, wherein the first and second heat pipes both comprise a liquid that evaporates to absorb thermal energy and then condenses to release the thermal energy, the release of the thermal energy being into the earth below the ground.

17. A computing device cooling system comprising:
multiple heat pipes extending below ground, each into different and separate portions of the earth;
a surface that is thermally coupled to the multiple heat pipes via a liquid that is heated by the surface and cooled by at least one of the multiple heat pipes; and
valves controlling the thermal coupling of the surface to individual ones of the multiple heat pipes so that at least one heat pipe remains thermally uncoupled from the surface for at least a predefined period of time before it is again thermally coupled to the surface, thereby avoiding heat soak.

18. The computing device cooling system of claim 17, further comprising piping that is thermally coupled to the surface and to the multiple heat pipes, wherein the liquid flows through the piping.

19. The computing device cooling system of claim 17, wherein at least some of the heat pipes comprise a liquid that evaporates to absorb thermal energy and then condenses to release the thermal energy, the release of the thermal energy being into the earth below the ground.

20. The computing device cooling system of claim 17, further comprising:
a conduit carrying a liquid;
a second thermal coupling between the conduit and at least one computing device, the second thermal coupling causing the liquid to warm, the warm liquid then rising within the conduit;
a cooling apparatus located physically higher than the least one computing device;
a third thermal coupling between the conduit and at least some of the multiple heat pipes, the third thermal coupling causing the warm liquid to cool, the cool liquid then descending within the conduit;
wherein the cool liquid is drawn, within the conduit, past the second thermal coupling between the conduit and at least one computing device as a consequence of the warm liquid rising within the conduit.

* * * * *